US006781219B2

(12) United States Patent
Bissey

(10) Patent No.: US 6,781,219 B2
(45) Date of Patent: *Aug. 24, 2004

(54) SEMICONDUCTOR DIE ASSEMBLY HAVING LEADFRAME DECOUPLING CHARACTERS

(75) Inventor: Lucien J. Bissey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/229,845

(22) Filed: Aug. 27, 2002

(65) Prior Publication Data

US 2003/0011050 A1 Jan. 16, 2003

Related U.S. Application Data

(63) Continuation of application No. 09/939,342, filed on Aug. 24, 2001, now Pat. No. 6,504,236, which is a continuation of application No. 09/645,909, filed on Aug. 25, 2000, now Pat. No. 6,310,388, which is a continuation of application No. 09/417,160, filed on Oct. 12, 1999, now Pat. No. 6,184,574, which is a continuation of application No. 08/864,727, filed on Jun. 6, 1997, now Pat. No. 6,054,754.

(51) Int. Cl.[7] .......................... H01L 1/14; H01L 23/12; H01L 23/02; H01L 25/00
(52) U.S. Cl. ...................... 257/666; 257/532; 257/676; 257/916; 257/724; 257/659; 257/696; 257/698; 257/784; 361/306.2
(58) Field of Search ................................ 257/666, 532, 257/676, 916, 724, 659, 696, 698, 691, 784, 787; 361/306.2

(56) References Cited

U.S. PATENT DOCUMENTS

| 4,410,905 A | 10/1983 | Grabbe |
| 4,680,613 A | 7/1987 | Daniels et al. |
| 4,891,687 A | 1/1990 | Mallik et al. |

(List continued on next page.)

FOREIGN PATENT DOCUMENTS

| DE | 3626151 | 2/1988 |
| JP | 6393139 | 4/1988 |
| JP | 3165549 | 7/1991 |
| JP | 3276747 | 12/1991 |
| JP | 4162657 | 6/1992 |
| JP | 4188759 | 7/1992 |
| JP | 6045504 | 2/1994 |

OTHER PUBLICATIONS

Hyperquad Series Type 5, Three Metal Layer QFP (TM QFP), 2 pages.
English translation of Japanese Patent No. 4188759.

*Primary Examiner*—Alexander Oscar Williams
(74) *Attorney, Agent, or Firm*—TraskBritt

(57) ABSTRACT

A packaged integrated circuit device with a multi-level leadframe has a plurality of integral capacitors formed by placing a thin dielectric layer between a lower leadframe and an upper leadframe, one of the leadframes being subdivided into a plurality of portions, each subdivided portion with an accessible tab for wire attachment. The planar capacitors are bonded to the bottom surface of the semiconductor chip and act as a die support paddle. Each capacitor may be configured to provide the desired voltage decoupling and noise suppression for a particular portion of the integrated circuit to which it is connected. Capacitors useful for other purposes may be likewise provided in the package.

54 Claims, 2 Drawing Sheets

U.S. PATENT DOCUMENTS

| | | |
|---|---|---|
| 4,965,654 A | 10/1990 | Karner et al. |
| 4,984,059 A | 1/1991 | Kubota et al. |
| 4,989,117 A | 1/1991 | Hernandez |
| 4,994,936 A | 2/1991 | Hernandez |
| 5,032,895 A | 7/1991 | Horiuchi et al. |
| 5,068,708 A | 11/1991 | Newman |
| 5,095,402 A | 3/1992 | Hernandez et al. |
| 5,103,283 A | 4/1992 | Hite |
| 5,105,257 A | 4/1992 | Michii |
| 5,140,496 A | 8/1992 | Heinks et al. |
| 5,200,364 A | 4/1993 | Loh |
| 5,212,402 A | 5/1993 | Higgins, III |
| 5,214,845 A | 6/1993 | King et al. |
| 5,235,209 A | 8/1993 | Shimizu et al. |
| 5,237,202 A | 8/1993 | Shimizu et al. |
| 5,272,590 A | 12/1993 | Hernandez |
| 5,281,556 A | 1/1994 | Shimizu et al. |
| 5,291,060 A | 3/1994 | Shimizu et al. |
| 5,311,056 A | 5/1994 | Wakabayashi et al. |
| 5,311,057 A | 5/1994 | McShane |
| 5,365,106 A | 11/1994 | Watanabe |
| 5,457,340 A | 10/1995 | Templeton, Jr. et al. |
| 5,485,037 A | 1/1996 | Marrs |
| 5,528,083 A | 6/1996 | Malladi et al. |
| 5,552,631 A | 9/1996 | McCormick |
| 5,559,306 A | 9/1996 | Muhulikar |
| 5,572,065 A | 11/1996 | Burns |
| 5,606,199 A | 2/1997 | Yoshigai |
| 5,726,490 A | 3/1998 | Moroi |
| 5,734,198 A | 3/1998 | Stave |
| 6,054,754 A | 4/2000 | Bissey |
| 6,184,574 B1 | 2/2001 | Bissey |
| 6,310,388 B1 | 10/2001 | Bissey |
| 6,504,236 B2 * | 1/2003 | Bissey .................. 257/666 |

* cited by examiner

SEMICONDUCTOR DIE ASSEMBLY HAVING LEADFRAME DECOUPLING CHARACTERS

CROSS-REFERENCE TO RELATED APPLICATIONS

This application is a continuation of application Ser. No. 09/939,342, filed Aug. 24, 2001, now U.S. Pat. No. 6,504,236, issued Jan. 7, 2003, which is a continuation of application Ser. No. 09/645,909, filed Aug. 25, 2000, now U.S. Pat. No. 6,310,388 B1, issued Oct. 30, 2001, which is a continuation of application Ser. No. 09/417,160, filed Oct. 12, 1999, now U.S. Pat. No. 6,184,574 B1, issued Feb. 6, 2001, which is a continuation of application Ser. No. 08/864,727, filed Jun. 6, 1997, now U.S. Pat. No. 6,054,754, issued Apr. 25, 2000.

BACKGROUND OF THE INVENTION

1. Field of the Invention

This invention relates generally to semiconductor devices having molded housings. More particularly, the invention pertains to an apparatus and method for suppressing power supply voltage modulation and noise in packaged integrated circuits (ICs) such as leaded or unleaded chip carriers, dual-in-line packages (DIP), pin-grid array packages, leads-over-chip (LOC) packages, quad flat packages (QFP) and other packages.

2. State of the Art

A modern packaged integrated circuit (IC) comprises one or more encapsulated semiconductor die(s) or chip(s) within a protective "package" of plastic, ceramic, or other material. A plurality of external connections, typically designed for soldering, are connected to bond pads on the encapsulated die(s), enabling the die(s) to be electrically connected to an external electrical apparatus including a power supply.

Despite the relatively short distance between external terminals of a semiconductor device and the integrated circuit chip or die within the package, inductance is present from outer leads, inner leads, wire bonds and other conductors connected to the power supply. The high switching speeds of digital circuits require relatively high levels of instantaneous current to achieve the desired switching operations. In such high frequency switching operations of integrated circuits (IC), the inductance results in the coupling of transient energy into the power supply circuit to modulate the power supply voltage. The modulation of the power supply voltage will be equal to the product of the inductance and the time rate of change of the current through the conductor. The power supply modulation, generally referred to as power supply noise, may cause malfunctions in the IC circuit, degrading the overall performance of the resin-encapsulated integrated circuit and/or rendering the packaged IC unusable.

To reduce this problem, it has been proposed in Japanese Patent No. A6045504 of Miyazaki Oki Electric Co. Ltd. to provide a plurality of metal plates attached to the upper and lower surfaces of a leadframe by an insulative adhesive. A reduction in "lead cross-talk noise" is claimed, although none of the plates is shown as being electrically connected to the circuit to provide capacitance.

It has been found, however, that a more effective device to reduce lead inductance is to provide leads of greater size and/or of shorter length.

Thus, in U.S. Pat. No. 5,032,895 of Horiuchi et al., a quad flat package (QFP) structure is shown in which a metal plate is adhered to the leadframe beneath the chip. The metal plate is connected to an external power supply and serves as a power lead for the chip. The size of the metal plate reduces the inductance of the device. Use of a decoupling capacitor is not disclosed.

U.S. Pat. No. 5,105,257 of Michii discloses the use of large coplanar trapezoidal power leads and a ground lead underlying the chip of a semiconductor device for reducing lead inductance and increasing heat transfer. No capacitor is shown.

A much more effective solution for decoupling transient coupled energy in the integrated circuit is to connect a decoupling capacitor across the affected portion(s) of the circuit. The capacitor counters the transient voltage changes and suppresses the resulting noise.

An early suppressor of the undesirable electrical coupling comprised a decoupling capacitor mounted on a circuit board, e.g., separate from the packaged IC, but connected across the power supply, i.e., across the power plane and ground plane leads. The length of the conductive path between the external decoupling capacitor and the chip circuit was, of necessity, lengthy. In many instances, the path length resulted in high inductance and caused high voltage drops due to such inductance.

Subsequently, decoupling capacitors have been mounted on the IC package itself in order to reduce the conductive lead length between the capacitor and the chip. For example, a monolithic multilayer decoupling ceramic chip capacitor may be attached to the underside of an IC package.

Recent developments have resulted in the need for an improved decoupling capacitor. First, the numbers of inner leads in a package have escalated, requiring that lead width be reduced and lead length increased. As a result of longer, narrower leads, lead inductance and electrical coupling between adjacent inner leads become operational problems under more benign conditions.

In addition, the power dissipation required of many newer chip packages has been significantly increased, such that coupling produces more severe voltage aberrations and noise in the power supply circuit.

Also, newer electronic equipment operates at higher clock rate frequencies which, of course, increases the incidence of coupling and the resulting noise.

Furthermore, certain particular applications for packaged integrated circuits may be much more demanding. For example, in some applications, ICs must be capable of withstanding high ionizing radiation without failure.

Various decoupling schemes have been developed to cope with these recent developments. In U.S. Pat. No. 4,680,613 of Daniels et al., for example, a metal ground plane is attached to the leadframe with encapsulant during the encapsulation process and becomes a ground lead with low inductive impedance. In addition, however, a multilayer capacitor (MLC) chip is placed within the polymer IC package remote from the chip.

Ideally, the decoupling capacitor should be as close to the chip or die as possible to reduce the lead induction and maximize its suppressive effect. Thus, the capacitor will be encapsulated within the IC package and typically will closely parallel the die surface. Various attempts to produce such a package are shown in the patent literature as follows:

U.S. Pat. No. 4,410,905 of Grabbe shows a decoupling structure for a semiconductor device, wherein a chip is mounted atop a beryllium oxide sliver. The upper surface of a chip carrier has an interdigitated lead pattern, and is bonded by a bonding agent to the underside of the beryllium oxide sliver.

In U.S. Pat. No. 4,891,687 of Mallik et al., a chip carrier and a leadframe have interposed therebetween a pair of parallel metal plates comprising an upper ground plane and a lower power plane. The metal plates are joined by Kapton® tape, and a chip is mounted within a space in the plates to the power plane. Decoupling capacitors may be installed between the two metal plates.

In U.S. Pat. No. 5,140,496 of Heinks et al., one or more decoupling capacitors are placed directly atop or beneath the chip and connected by multiple wire bonds to power supply connections on the chip surface.

U.S. Pat. No. 4,994,936 of Hernandez shows a packaged integrated circuit in which a decoupling capacitor is attached to the upper die surface or to the underside of the leadframe.

Japanese Patent Application No. 64-305219 of Seiko Epson Corporation describes a semiconductor device in which an electrode is bonded to a portion of an underlying leadframe by a dielectric material. The die is then bonded to the electrode with an insulative film. The leadframe portion and electrode are then connected to the die to form a capacitor.

Japanese Patent No. A 3276747 of NEC Corporation describes a 2-layer chip support member including leadframe planes having an interposed insulation layer. The two planes are electrically connected to a Vcc power source and a ground power source, respectively, to provide noise-preventing capacitance.

In Japanese Patent No. A 4162657 of Hitachi Ltd., a semiconductor device is shown which has a two-part leadframe with parallel tab parts joined by a dielectric material such as ceramic. A die is mounted on the upper tab part and the two tab parts are electrically connected across the power supply to provide a capacitor.

Japanese Patent No. A 4188759 of Mitsubishi Electric Corporation discloses a semiconductor device having a planar capacitor formed of two leadframes joined by an insulator, the capacitor underlying the chip.

Although the state of the art in package configuration is continually improving, ever-increasing demands for further miniaturization, circuit complexity, higher clock rates, higher production speed, reduced cost, improved product uniformity and reliability require further improvements in packaged semiconductor devices by which electrical coupling and inductance noise are minimized or eliminated.

BRIEF SUMMARY OF THE INVENTION

The invention comprises an apparatus and method for suppressing power supply voltage modulation and noise in packaged integrated circuits (ICs) such as leaded or unleaded chip carriers, dual-in-line packages (DIP), pin-grid array packages, leads-over-chip (LOC) packages, quad flat packages (QFP) and other packages.

In the present invention, an integrated circuit device includes a plurality of integral flat capacitors closely aligned with and parallel to a major surface of the die (chip). One or more of the capacitors may be connected across power supply leads and/or other lead pairs to reduce coupling and suppress noise produced thereby. The present invention further includes a method for forming the integrated circuit device including the integrated circuit and decoupling capacitor(s).

The integrated circuit device includes a multiple layer leadframe. One layer of the leadframe comprises a first conductive layer of the decoupling capacitor(s). A second layer of the leadframe comprises a second, opposite conductive layer of the capacitor(s), and the two layers are joined by an interposed dielectric material to create the capacitor(s). Together, the layers may be looked upon as a "paddle" or "die support platform" to which a die is downbonded.

One or both of the leadframe layers are subdivided to form multiple capacitors having different capacitances and/or adapted to optimally operate at different switching frequencies. Each capacitor may be connected across a different portion of the integrated circuit, enabling custom design of capacitors appropriate for each circuit portion. In one embodiment, one leadframe layer may be a single "plate" common to a plurality (or all) of the capacitors and connected to the power supply ground plane Vss, or to another common voltage plane.

The decoupling capacitor(s) are closely positioned to the die, i.e. chip, enabling the use of short wire leads. Thus, conductor inductances between the capacitor(s) and the bond pads on the die are much reduced.

The invention may be applied to a leads-over-chip device by including a third (uppermost) leadframe member which includes lead fingers which partially overlie the active surface of the chip and outer leads connected to the lead fingers for connecting the device to a circuit board or other apparatus.

The device, including one or more integral decoupling capacitors, is encapsulated by a plastic material such as epoxy, using transfer molding techniques or other encapsulation methods known in the art.

The plurality of special capacitors produces more effective decoupling of coupled electrical aberrations in various circuit portions. In addition, the overall inductance in the integrated circuit conductors is reduced. Furthermore, it is evident that one or more of the capacitors may be configured for use as circuit elements other than a decoupler/noise suppressor. Thus, one or more of the capacitors may be connected to the IC circuitry to provide a capacitor connected thereto rather than having to build a capacitor in the integrated circuit on the chip.

The invention is illustrated in the following figures, wherein the elements are not necessarily shown to scale.

The figures illustrate the invention as applied to a die having an array of wire bond pads along opposing peripheral portions of its active surface. However, other die/lead configuration may be useful, such as the quad flat package (QFP), for example. Thus, the figures should be viewed as exemplary of the invention and not limiting the invention to the exact embodiment shown.

DETAILED DESCRIPTION OF THE INVENTION

An improved packaged integrated circuit device and method of production thereof are provided by the invention. The integrated circuit package includes a plurality of integral capacitors of which one or more may comprise decoupling/noise suppression capacitors.

Figure 1:
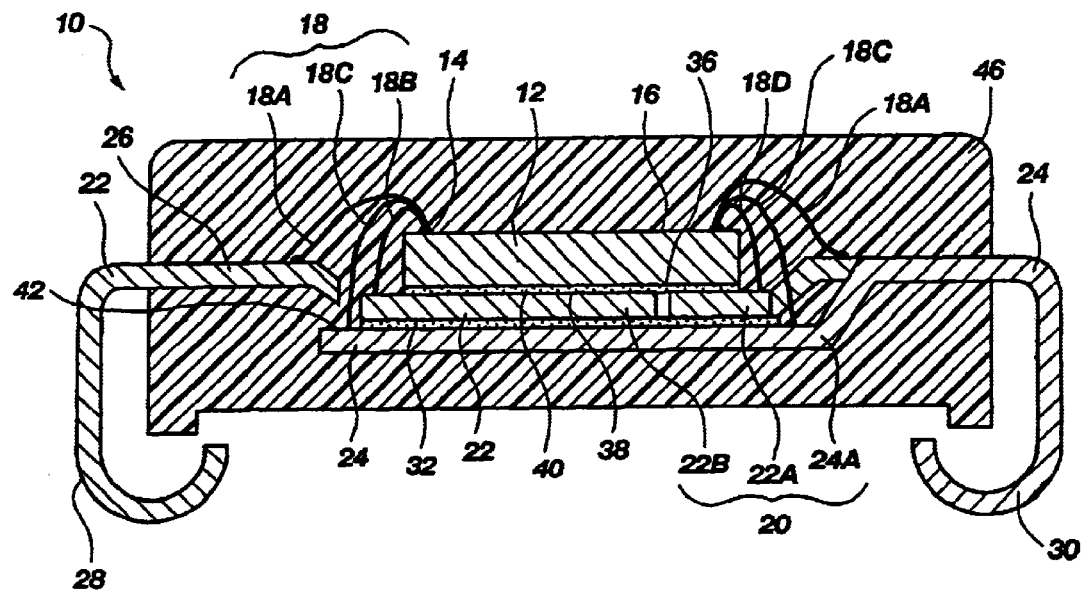
FIG. 1 is a cross-sectional end view through a packaged integrated circuit of the invention.
Figure 3:
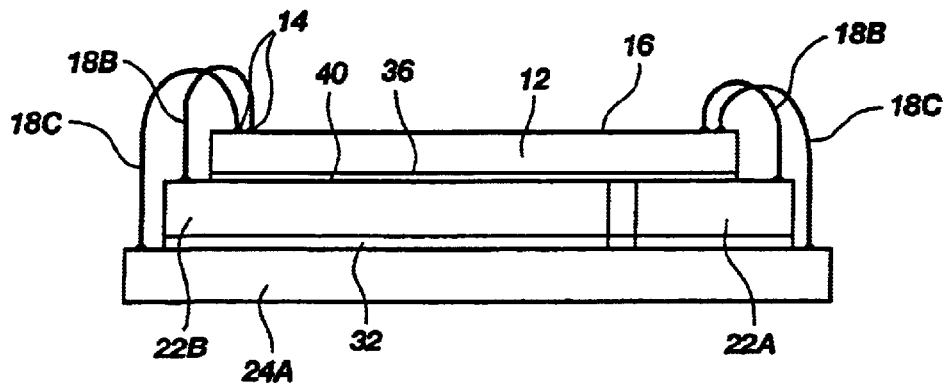
FIG. 3 is a cross-sectional end view of a packaged integrated circuit of the invention.
Figure 2:
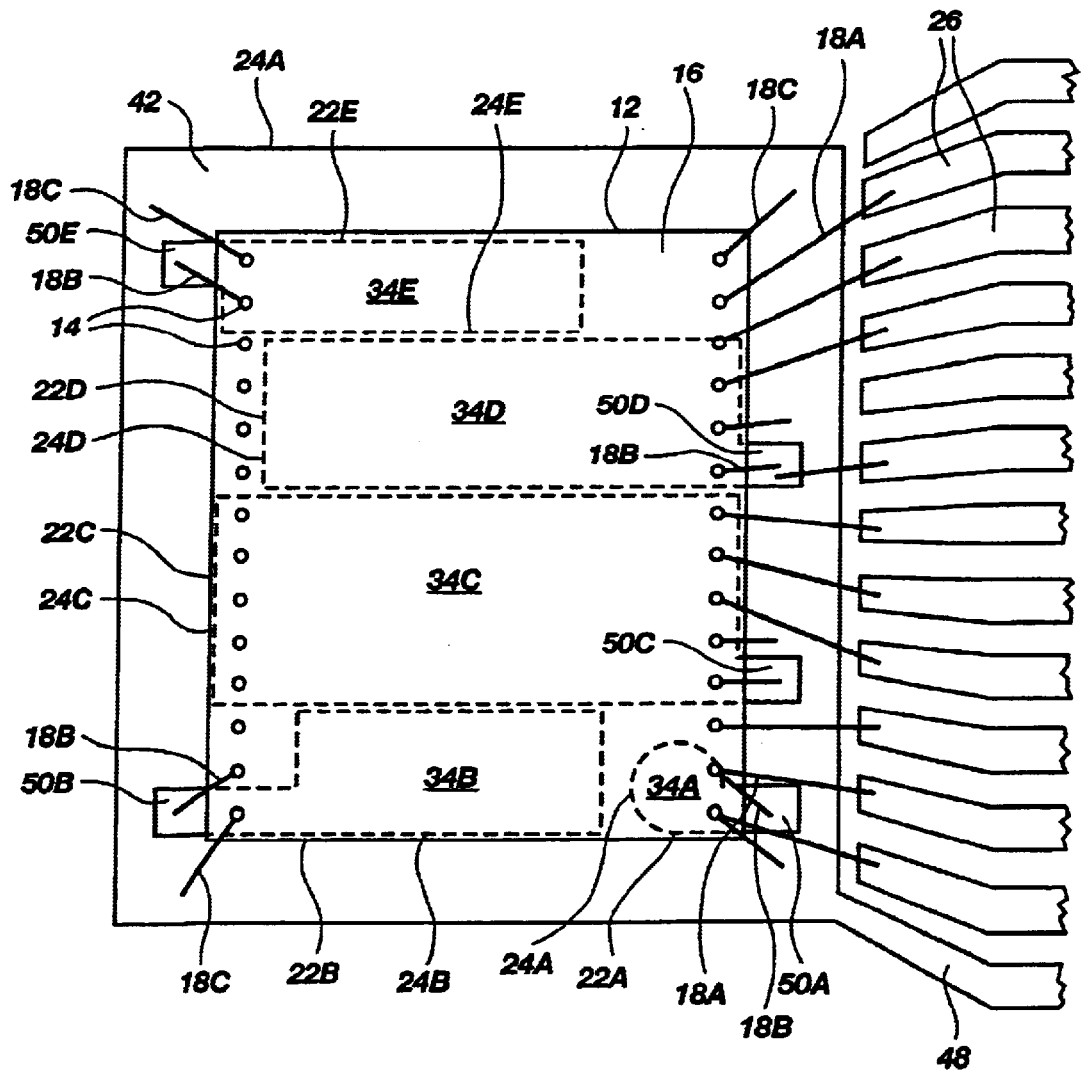
FIG. 2 is a partial top view of the packaged integrated circuit of FIG. 1 showing the internal construction.

With reference to the drawings of FIGS. 1–4, and particularly with reference to FIGS. 1 to 3, a packaged integrated circuit device 10 is illustrated in cross-section. The present invention is well suited for use with any type of molded IC package including, but not limited to, plastic leaded or leadless chip carriers, dual-in-line packages and quad flat packs. All components of the packaged integrated circuit device 10 are encapsulated in a protective material 46, typically plastic, with the exception of the external leads, e.g. J-leads 28 and 30.

The packaged integrated circuit device 10 includes a semiconductor chip 12, typically of silicon or gallium arsenide. The semiconductor chip 12 is shown with wire bond pads 14 on its upper, active surface 16 for attachment of conductive wires 18 thereto. A multi-level leadframe 20 comprises an upper leadframe 22 and a lower leadframe 24. Upper leadframe 22 includes planar upper leadframe portions 22A and 22B, as well as lead fingers 26 and outer lead 28, shown as a J-lead. Lower leadframe 24 includes a planar lower leadframe portion 24A as well as an outer lead 30, also shown as a J-lead.

As indicated, upper leadframe portions 22A and 22B are joined to lower leadframe portion 24A by a thin layer 32 of a selected dielectric material such that the upper leadframe portion 22A and lower leadframe portion 24A with interposed layer 32 of dielectric material comprise a first capacitor 34A. Likewise, upper leadframe portion 22B together with lower leadframe portion 24B and interposed dielectric material layer 32 comprise a second capacitor 34B.

The semiconductor chip 12 has its lower surface 36 attached to the upper surface 38 of the upper leadframe portions 22A, 22B by an insulative adhesive 40 such as an epoxy, polyimide, or other adhesive. Thus, the combinations of upper and lower leadframe portions with interposed dielectric layer 32 not only comprise a plurality of capacitors 34, but also serve as a die support platform, i.e. paddle.

The dielectric may be any conventional dielectric material providing the desired capacitive properties and having the capability of being firmly adhered to the leadframe members. Preferably, the dielectric is a polymeric adhesive material, although it may be otherwise, e.g. ceramic joined to the leadframe portions by a conductive adhesive. The dielectric properties, i.e. dielectric constant $K_\epsilon$ and dielectric strength, volts/mil, of polymeric materials vary widely, and may be tailored to suit particular requirements.

Various methods may be used to form the dielectric material layer between the upper and lower leadframe portions. Where the dielectric material comprises a liquid resin adhesive which is thermally or radiation curable, or simply dryable at ambient conditions, the process includes application of a thin layer on one leadframe portion followed by joining to the other leadframe portion and curing.

For some dielectric materials which are obtained in film form, the film may be joined to each leadframe member by a thin layer of conductive or non-conductive adhesive.

Examples of polymeric dielectric film materials useful in forming the interposed layer 32 of the capacitors 34 include polytetrafluoroethylene, Kapton™ film, and Mylar® plastic film, both trademarked products of DuPont. Such materials have a very high insulation resistance, typically greater than 1000 MΩ, low losses and a long service life.

Each of the upper leadframe portions 22A and 22B may be insulatively attached to the lower leadframe portion 24A by a different dielectric material having different electrical properties, so that the resulting capacitors 34 have different capacitances and/or may operate as decoupling capacitors in a differing range of switching frequencies. In addition, capacitors useful for purposes other than noise suppression and decoupling may be formed using the upper and lower leadframe portions and incorporated in the circuit within the packaged integrated circuit device 10. Placement of multiple integral capacitors within the IC package in accordance with this invention not only results in a small package but enhances both the operating characteristics and the range of usefulness of the IC.

Thus, a first capacitor may be a high end frequency noise suppression capacitor and a second capacitor may be a low end frequency noise suppression capacitor. By designing each capacitor 34 to have a particular capacitance, both high frequency noise suppression and decoupling will occur simultaneously in the packaged integrated circuit device 10.

The electrical characteristics of each capacitor 34 are dependent upon a number of variables, including surface area, shape, type and thickness of dielectric material, etc. Thus, each capacitor 34 may be specifically tailored for its designated use.

A capacitor 34 useful for decoupling and noise suppression may be connected across the Vss and Vdd leads, for example, to provide decoupling and noise suppression in that conductor pair. As a result, the power supply voltage will be maintained within the limits required by the integrated circuit for proper operation.

As illustrated in FIG. 1, thin conductive wires 18 are bonded at one end to appropriate wire bond pads 14 on the semiconductor chip 12 and at the opposite end to lead fingers 26 (wires 18A), to upper leadframe portions 22A and 22B (wires 18B and 18D, respectively), and to lower leadframe portion 24A (wires 18C).

In the embodiment of the invention illustrated in FIG. 1, lower leadframe portion 24A is formed with an external lead 30 such as a J-lead whereby the lower leadframe portion may be connected to a Vss or Vdd side of the power supply to the semiconductor chip 12. The lower leadframe portion 24A has an exposed upper surface 42 at its periphery to which conductive wires 18C may be connected, joining wire bond pads 14 on the semiconductor chip active surface 16 with the lower leadframe portion 24A. Thus, the lower leadframe portion 24A may comprise one side of a plurality of individually tailored capacitors 34 and also serve as a bus for Vss or Vdd.

The leadframes 22, 24 which comprise the multi-level leadframe 20 are made by stamping or etching a pattern of inner lead fingers, outer leads, die mount, etc. in each of several thin plates formed of a conductive metal such as a copper alloy. The leads, die mount and other portions of the multi-level leadframe 20 are interconnected by crossbars for support during the assembly process. As known in the art, the crossbars are later excised from the pattern to singulate the leads and other components of the multi-level leadframe 20, electrically isolating them from each other.

FIGS. 2 and 3 illustrate, in part, the major components of the integrated circuit prior to encapsulation. For the sake of clarity, lead fingers 26 are shown on one side only of the semiconductor chip 12 in FIG. 2, and not at all in FIG. 3. Generally rectangular lower leadframe portion 24A is shown with exposed upper peripheral surface 42. Lower leadframe portion 24A is shown with a connected lead which terminates in a J-lead 30 (see FIG. 1). The J-lead 30 may be connected to one of the power supply terminals, providing the lower leadframe portion 24A with Vss or Vdd. The substantial expanse of exposed peripheral surface 42 enables the lower leadframe portion 24A to be readily accessed by wires 18C from wire bond pads 14 on the active surface 16 of the semiconductor chip 12 to provide Vss or Vdd to the semiconductor chip.

FIG. 2 illustrates an example of the invention, showing five upper leadframe portions 22A, 22B, 22C, 22D and 22E, each occupying a portion of the underside of the semiconductor chip 12 and outlined by intermittent lines. Each of the upper leadframe portions, together with the underlying lower leadframe portion 24A and intervening dielectric material layer 32, comprises a capacitor 34. Thus, upper leadframe portions 22A, 22B, 22C, 22D and 22E correspond to capacitors 34A, 34B, 34C, 34D and 34E. Each of the upper leadframe portions is shown with an integral tab 50A, 50B, 50C, 50D, and 50E (collectively referred to as "tabs 50"), respectively, to which conductive wires 18B are attached for connecting the upper leadframe portions to wire bond pads 14 on the active surface 16. Conductive wires 18A connect other wire bond pads 14 to lead fingers 26 which terminate in external leads such as J-leads. The layer 32 of dielectric material and the insulative adhesive 40 which bonds the semiconductor chip 12 to the upper leadframe portions are not visible in FIG. 2.

Preferably, the area of the lower surface of the semiconductor chip 12 is at least one-half occupied by the upper leadframe portion 22 to enhance the attachment. However, at least some portion of each upper lead portion 22 extends outwardly from the semiconductor chip outline to enable connection by wire bonds thereto.

Because of size limitations, the number of individual capacitors formed by subdividing the upper leadframe portion 22 will be generally limited, typically to less than about 6–10. Thus, the tabs 50 will generally overlie only a small portion of the exposed peripheral surface 42 of the lower leadframe portion 24A. Preferably, the lower leadframe portion 24A may be minimized in size to extend out from the semiconductor chip 12 no more than is necessary to join the conductive wires 18C thereto. Thus, the overall package size will be less than packages of the prior art which use a single tubular decoupling capacitor.

Figure 4:
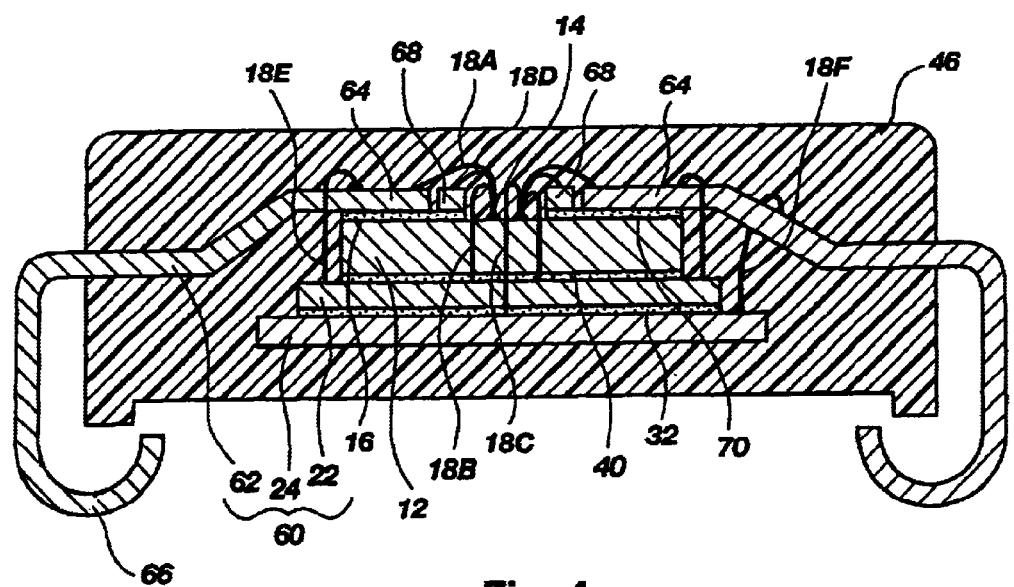
FIG. 4 is a cross-sectional end view of another embodiment of the packaged integrated circuit of the invention.

While FIGS. 1–3 illustrate the multi-level leadframe 20 as comprised of two leadframe portions 22 and 24, a third leadframe portion having a major portion or all of the lead fingers and outer leads may be combined therewith in the uppermost position, particularly where a leads-over-chip (LOC) configuration is used. As illustrated in FIG. 4, a 3-level leadframe 60 includes upper leadframe 22, lower leadframe 24 and a third uppermost leadframe 62. The third uppermost leadframe 62 is configured to have lead fingers 64 and two transverse buses 68 overlying the upper active surface 16 of a LOC semiconductor chip 12 and extending outwardly to external terminals, e.g. J-leads 66. The capacitors are formed of the upper leadframe 22, lower leadframe 24 and intervening dielectric material layer 32.

The upper and/or lower leadframes 22 and 24 may have portions which extend from the formed capacitor(s) to particular leads of the third uppermost leadframe 62, as previously illustrated in FIG. 1.

FIG. 4 illustrates wires 18A which connect the wire bond pads 14 with the lead fingers 64, while conductive wires 18B connect wire bond pads 14 with the various upper leadframe portions 22, i.e. 22A, 22B, etc. In addition, conductive wires 18C connect wire bond pads 14 with the lower leadframe 24. Conductive wires 18D connect wire bond pads 14 with the transverse buses 68.

Other alternative wire connections are shown, although they are not the preferred embodiment. Thus, conductive wires 18E and 18F connect lead fingers 64 with the upper leadframe 22 and the lower leadframe 24, respectively.

It is advantageous in this embodiment to provide Vss and Vdd transverse buses 68 adjacent the lead fingers 64 in the third uppermost leadframe 62, because of the distance between the centrally located wire bond pads 14 and the lower leadframe 24, and the lack of space resulting from the lead fingers 64. The pattern of lead fingers in the third uppermost leadframe 62 may be configured to permit the necessary space for connecting conductive wires 18E and 18F from lead fingers 64 to the upper and lower leadframes 22 and 24, respectively. As practiced in the art, the lead fingers 64 are separated from the active surface 16 by an insulative layer 70 such as Kapton™ tape, a registered trademark of DuPont.

In FIGS. 1–4, the capacitors 34A, 34B, . . . are illustrated with the upper leadframe 22 subdivided to provide multiple capacitors. In an alternative construction, the lower leadframe 24 is subdivided into tabbed leadframe portions 24A, 24B, 24C, etc., each comprising one side of a capacitor 34. One advantage of this configuration is that the possibility of entrapping gases during encapsulation in the relatively narrow spaces formed by subdividing the leadframe is much reduced, the subdivided leadframe being open on one side.

The IC device may also be encapsulated in an inverse position. Thus, the integrated circuits of FIGS. 1 and 4 may be inverted within the protective material 46.

In the manufacture of packaged integrated circuit devices 10 of the invention, the steps involved include:

(a) forming a multi-level conductive leadframe with a planar lower leadframe portion and a planar upper leadframe portion partially coextensive therewith, the upper leadframe portion configured to support a semiconductor chip and subdivided into a plurality of coplanar units with outwardly extending conductive tabs, the leadframe including centrally directed inner leads formed in one of the leadframe portions;

(b) joining the upper surface of the lower leadframe portion to the lower surface of the subdivided upper leadframe portion with an intervening thin layer of dielectric material, whereby each of the plurality of units having upper and lower leadframe portions with intervening dielectric material comprises a capacitor;

(c) bonding the non-active surface of a semiconductor chip to the upper surface of the subdivided upper leadframe portion with an insulative adhesive;

(d) lancing the leadframe portions to singulate inner leads;

(e) bonding conductive wires between wire bond pads on the active surface of the semiconductor chip and the inner leads, the conductive tabs of the subdivided upper leadframe portion, and the lower leadframe portion;

(f) encapsulating the semiconductor chip, inner leads, plurality of capacitors, and conductive wires in a plastic package by, e.g., transfer molding; and (g) lance-singulating and forming outer leads for connecting the packaged integrated circuit to an electronic apparatus such as a circuit board.

Where the semiconductor chip or die is of the LOC design, i.e. the wire bond pads are generally located along a central axis of the active surface, the multi-level leadframe will include a third leadframe portion having inner leads with lead fingers and outer leads.

As previously described, the lower leadframe portion may be subdivided, either in addition to, or in place of, subdivision of the upper leadframe portion. Thus, in one embodiment, each of the formed capacitors requires two electrical connections. Where one of the leadframe portions is common to all of the capacitors, the number of electrical connections to the capacitors is reduced, simplifying the construction.

The IC package having integral capacitors of the invention, as illustrated and described herein, is exemplary only and may include other elements such as additional dice and leadframes, heatsinks, other dielectric layers, etc., as known in the art.

It is apparent to those skilled in the art that various changes and modifications may be made in the integrated circuit manufacturing methods and products as disclosed herein without departing from the spirit and scope of the invention as defined in the following claims.

What is claimed is:

1. An assembly having a semiconductor die having at least one integrated circuit therein having a first active surface having, in turn, at least one contact pad arranged thereon, and having a second surface and having a leadframe, the assembly comprising:
    an upper conductive planar leadframe member having an upper surface attached to at least a portion of the second surface of the semiconductor die using an electrically insulative adhesive, and having a lower surface, the upper conductive planar leadframe member subdivided into a plurality of portions, at least one portion of the plurality of portions having an exposed tab connected to the at least one integrated circuit of the semiconductor die;
    a lower conductive planar leadframe member having an upper surface mounted to the upper conductive planar leadframe member using a thin intervening layer of dielectric material for capacitance therebetween, the lower conductive planar leadframe member subdivided into a plurality of portions for matching corresponding portions of the plurality of portions of the upper conductive planar leadframe, the lower conductive planar leadframe member cooperating with the upper conductive planar leadframe member for capacitance purposes;
    at least one lead of a plurality of leads connecting the at least one contact pad to at least one lead finger;
    at least one other lead of the plurality of leads connected to the exposed tab of the at least one portion of the upper conductive planar leadframe member, and material encapsulating at least the semiconductor die.

2. The assembly of claim 1, wherein the lower conductive planar leadframe member is unitary and is connected to one of a power supply Vss and Vdd to provide a common voltage to the lower conductive planar leadframe member.

3. The assembly of claim 1, wherein the plurality of portions of the upper conductive planar leadframe member includes one portion configured for high end frequency noise suppression and another portion for low end frequency noise suppression.

4. The assembly of claim 1, wherein the plurality of portions of the upper conductive planar leadframe member includes a portion configured for decoupling of high transient voltage, the portion together with the lower conductive planar leadframe member electrically connected across one of a power supply Vdd and Vss of the at least one integrated circuit.

5. The assembly of claim 1, wherein the upper and lower conductive planar leadframe members together comprise a portion of a multi-level leadframe.

6. The assembly of claim 1, wherein the at least one contact pad includes a contact pad arrayed along a periphery of at least one side of the first active surface of the semiconductor die.

7. The assembly of claim 1, further comprising:
    an uppermost leadframe member including inner lead fingers and external leads.

8. The assembly of claim 1, wherein the semiconductor die comprises:
    an LOC semiconductor die having at least one contact pad arrayed along a substantially central axis thereof.

9. The assembly of claim 1, wherein the at least one other lead of the plurality of leads connected to the exposed tab of the at least one portion of the upper conductive planar leadframe member comprises a conductive wire.

10. The assembly of claim 1, wherein the thin intervening layer of dielectric material is a polymeric adhesive.

11. The assembly of claim 1, wherein the thin intervening layer of dielectric material is a polymeric film joined to the upper and lower conductive planar leadframe members with an adhesive.

12. An assembly having a semiconductor die having at least one integrated circuit therein, having a first active surface having, in turn, at least one bond pad arranged thereon, and having a second surface and having a leadframe, the assembly comprising:
    an upper conductive planar leadframe member having an upper surface mounted to at least a portion of the second surface of the semiconductor die using an intervening electrically insulative adhesive, and having a lower surface, the upper conductive planar leadframe member subdivided into a plurality of portions;
    a lower conductive planar leadframe member having an upper surface mounted to the lower surface of the upper conductive planar leadframe member using a thin intervening layer of dielectric material for capacitance resulting therebetween, the lower conductive planar leadframe member subdivided into a plurality of portions, at least one portion of the plurality of portions of the lower conductive planar leadframe having an exposed tab connected to the at least one integrated circuit of the semiconductor die, the lower conductive planar leadframe member cooperating with the upper conductive planar leadframe member for capacitance purposes;
    at least one lead of a plurality of leads connecting the at least one bond pad to at least one lead finger;
    at least one other lead of the plurality of leads connected to the exposed tab of the at least one portion of the lower conductive planar leadframe member; and material encapsulating the semiconductor die.

13. The assembly of claim 12, wherein the upper conductive planar leadframe member is unitary and is connected to one of a power supply Vss and Vdd to provide a common voltage to the upper conductive planar leadframe member.

14. The assembly of claim 12, wherein the plurality of portions of the lower conductive planar leadframe member includes one portion configured for high end frequency noise suppression and another portion configured for low end frequency noise suppression.

15. The assembly of claim 12, wherein the plurality of portions of the lower conductive planar leadframe member includes a portion configured for decoupling of high transient voltage, the portion together with the upper conductive planar leadframe member electrically connected across one of a power supply Vdd and Vss of the at least one integrated circuit.

16. The assembly of claim 12, wherein the upper and lower conductive planar leadframe members together comprise a portion of a multi-level leadframe.

17. The assembly of claim 12, wherein the at least one bond pad includes at least one bond pad arrayed along a periphery of at least one side of the first active surface of the semiconductor die.

18. The assembly of claim 12, further comprising:
an uppermost leadframe member including inner lead fingers and external leads.

19. The assembly of claim 12, wherein the semiconductor die comprises:
an LOC semiconductor die having at least one bond pad arrayed along a substantially central axis thereof.

20. The assembly of claim 12, wherein the at least one other lead of the plurality of leads connected to the exposed tab of the at least one portion of the lower conductive planar leadframe member comprises a conductive wire.

21. The assembly of claim 12, wherein the thin intervening layer of dielectric material is a polymeric adhesive.

22. The assembly of claim 12, wherein the thin intervening layer of dielectric material is a polymeric film joined to the upper and lower conductive planar leadframe members with an adhesive.

23. An assembly having a housing, a semiconductor die located in the housing and a leadframe, the assembly comprising:
a semiconductor die having at least one integrated circuit therein, the semiconductor die having a first surface having, in turn, at least one bond pad arranged thereon and having a second surface, the at least one integrated circuit subject to transient electrical coupling and noise generation; and
a multi-level leadframe including:
an upper conductive planar leadframe member having an upper surface attached to at least a portion of the second surface of the semiconductor die using an intervening electrically insulative adhesive, and having a lower surface, the upper conductive planar leadframe member subdivided into multiple portions representing individual capacitors, at least one portion of the multiple portions having an exposed tab connected to the at least one integrated circuit;
a lower conductive planar leadframe member having an upper surface thereof mounted to the lower surface of the upper conductive planar leadframe member using a thin intervening layer of dielectric material, the lower conductive planar leadframe member subdivided into a plurality of coplanar portions representing individual capacitors, the lower conductive planar leadframe member cooperating with the upper conductive planar leadframe member for capacitance purposes;
at least one lead of a plurality of leads connecting the at least one bond pad to at least one lead finger; and
at least one other lead of the plurality of leads connected to the exposed tab of the at least one portion of the upper conductive planar leadframe member and across portions of the at least one integrated circuit of the semiconductor die subject to the transient electrical coupling and noise generation.

24. The assembly of claim 23, wherein the lower conductive planar leadframe member is unitary and is connected to one of a power supply Vss and Vdd to provide a common voltage to the lower conductive planar leadframe member.

25. The assembly of claim 23, wherein the multiple portions of the upper conductive planar leadframe member includes one portion configured for high end frequency noise suppression and another portion for low end frequency noise suppression.

26. The assembly of claim 23, wherein the multiple portions of the upper conductive planar leadframe member includes a portion configured for decoupling of high transient voltage, the portion together with the lower conductive planar leadframe member electrically connected across one of a power supply Vdd and Vss of the at least one integrated circuit.

27. The assembly of claim 23, wherein the at least one bond pad includes:
at least one bond pad arrayed along a periphery of at least one side of the first surface of the semiconductor die.

28. The assembly of claim 23, further comprising:
an uppermost leadframe member including inner lead fingers and external leads.

29. The assembly of claim 23, wherein the semiconductor die comprises:
an LOC semiconductor die having at least one bond pad arrayed along a generally central axis thereof.

30. The assembly of claim 23, wherein the at least one other lead of the plurality of leads connected to the exposed tab of the at least one portion of the upper conductive planar leadframe member comprises a conductive wire.

31. The assembly of claim 23, wherein the thin intervening layer of dielectric material is a polymeric adhesive.

32. The assembly of claim 23, wherein the thin intervening layer of dielectric material is a polymeric film joined to the upper and lower conductive planar leadframe members with an adhesive.

33. An assembly having a housing, a semiconductor die located in the housing and a portion of a leadframe, the assembly comprising:
a semiconductor die having an integrated circuit therein, having a first surface having, in turn, a plurality of bond pads arranged thereon and having a second surface, the integrated circuit of the semiconductor die subject to transient electrical coupling and noise generation; and
a multi-level leadframe including:
an upper conductive planar leadframe member having an upper surface attached to at least a portion of the second surface of the semiconductor die using an intervening electrically insulative adhesive, and having a lower surface, the upper conductive planar leadframe member subdivided into a plurality of coplanar portions representing individual capacitors;
a lower conductive planar leadframe member having at least a portion of an upper surface mounted to the lower surface of the upper conductive planar leadframe member using a thin intervening layer of dielectric material for capacitance therebetween, the lower conductive planar leadframe member subdivided into multiple portions, at least one of the multiple portions having an exposed tab connected to the integrated circuit and having tailored operating capacitance/frequency characteristics in cooperation with the upper conductive planar leadframe member;
at least one lead connecting at least one bond pad of the plurality of bond pads to at least one lead finger; and
at least one other lead connected to the exposed tab of the at least one portion of the lower conductive planar leadframe member and across portions of the integrated circuit of the semiconductor die subject to the transient electrical coupling and noise generation.

34. The assembly of claim 33, wherein the upper conductive planar leadframe member is unitary and is connected to one of a power supply Vss and Vdd to provide a common voltage to the upper conductive planar leadframe member.

35. The assembly of claim 33, wherein the multiple portions of the lower conductive planar leadframe member include one portion configured for high end frequency noise suppression and another portion configured for low end frequency noise suppression.

36. The assembly of claim 33, wherein the multiple portions of the lower conductive planar leadframe member include:

a portion configured for decoupling of high transient voltage, the portion together with the upper conductive planar leadframe member electrically connected across one of a power supply Vdd and Vss of the integrated circuit.

37. The assembly of claim 33, wherein the plurality of bond pads includes:

bond pads arrayed along a portion of a periphery of at least one side of the first surface of the semiconductor die.

38. The assembly of claim 33, further comprising an uppermost leadframe member including inner lead fingers and external leads.

39. The assembly of claim 33, wherein the semiconductor die comprises an LOC semiconductor die having a plurality of bond pads arrayed along a substantially central axis thereof.

40. The assembly of claim 33, wherein the at least one other lead connected to the exposed tab of the at least one portion of the lower conductive planar leadframe member comprises a conductive wire.

41. The assembly of claim 33, wherein the thin intervening layer of dielectric material is a polymeric adhesive.

42. The assembly of claim 33, wherein the thin intervening layer of dielectric material is a polymeric film joined to the upper and lower conductive planar leadframe members with an adhesive.

43. An assembly having a housing, a semiconductor die located in the housing and a portion of a leadframe, the assembly comprising:

a semiconductor die having an integrated circuit therein, having a first surface having, in turn, a plurality of bond pads arranged thereon and having a second surface for mounting the semiconductor die, the integrated circuit of the semiconductor die subject to transient electrical coupling and noise generation;

an upper conductive leadframe member having an upper surface mounted to at least a portion of the second surface of the semiconductor die using an intervening electrically insulative adhesive, and a lower surface, the upper conductive leadframe member subdivided into multiple portions, at least one of the multiple portions having at least one exposed tab connected to the integrated circuit and having tailored operating capacitance/frequency characteristics;

a lower conductive leadframe member having an upper surface mounted to the lower surface of the upper conductive leadframe member using a thin intervening layer of dielectric material for capacitance therebetween, the lower conductive leadframe member subdivided into multiple portions, at least one of the multiple portions of the lower conductive leadframe member having at least one exposed tab connected to the integrated circuit and having tailored operating capacitance/frequency characteristics;

leads connecting some of the plurality of bond pads to lead fingers; and leads connected to the upper and lower conductive leadframe members and across portions of the integrated circuit of the semiconductor die subject to the transient electrical coupling and noise generation.

44. The assembly of claim 43, wherein at least one leadframe member of the upper and lower conductive leadframe members is unitary and is connected to one of a power supply Vss and Vdd to provide a common voltage to the at least one leadframe member.

45. The assembly of claim 43, wherein the multiple portions of one of the upper and lower conductive leadframe members include one portion configured for high end frequency noise suppression and another portion configured for low end frequency noise suppression.

46. The assembly of claim 43, wherein the multiple portions of one of the upper and lower conductive leadframe members include a portion configured for decoupling of high transient voltage, the portion together with each of the upper and lower conductive leadframe members electrically connected across a Vdd and a Vss of the integrated circuit.

47. The assembly of claim 43, wherein the upper and lower conductive leadframe members together comprise a portion of a multi-level leadframe.

48. The assembly of claim 43, wherein the plurality of bond pads includes bond pads arrayed along a periphery of at least one side of the first surface of the semiconductor die.

49. The assembly of claim 43, further comprising an uppermost leadframe member including inner lead fingers and external leads.

50. The assembly of claim 43, wherein the semiconductor die comprises an LOC semiconductor die having bond pads arrayed along a substantially central axis thereof.

51. The assembly of claim 43, wherein the leads connected to the upper and lower conductive leadframe members comprise conductive wires.

52. The assembly of claim 43, wherein the thin intervening layer of dielectric material is a polymeric adhesive.

53. The assembly of claim 43, wherein the thin intervening layer of dielectric material is a polymeric film joined to the upper and lower conductive leadframe members with an adhesive.

54. A method of making an assembly having a semiconductor die having an active surface having a plurality of bond pads thereon and having a support surface, and having a leadframe, the method comprising:

providing a multi-level conductive leadframe having a lower leadframe portion and an upper leadframe portion partially coextensive therewith, the upper and lower leadframe portions each having upper and lower surfaces, the upper surface of the upper leadframe portion configured to be bonded to at least a portion of the support surface of the semiconductor die, the upper leadframe portion subdivided into a plurality of units, the lower leadframe portion subdivided into a plurality of units, one of the upper leadframe portion and the lower leadframe portion having at least one outwardly extending conductive tab, one of the lower and upper leadframe portions having centrally directed inner leads;

joining an upper surface of at least one of the plurality of units of the subdivided lower leadframe portion to a lower surface of one of the plurality of units of the subdivided upper leadframe portion using an intervening layer of a dielectric material located therebetween, each of the plurality of units formed from the upper leadframe portion and the plurality of units formed from the lower leadframe portion and the intervening layer of dielectric material comprising a capacitor;

bonding at least a portion of the support surface of the semiconductor die to the upper surface of the subdivided upper leadframe portion using an insulative material;

lancing the upper and lower leadframe portions to singulate inner leads therefrom;

bonding at least one conductive wire between at least one bond pad of the plurality of bond pads on the active surface of the semiconductor die and at least one inner lead of the inner leads;

encapsulating the semiconductor die, the inner leads, a plurality of the capacitors, and the at least one conductive wire in a package; and lancing external lead portions to form outer leads for connecting the package to an electronic apparatus.

* * * * *

UNITED STATES PATENT AND TRADEMARK OFFICE
CERTIFICATE OF CORRECTION

| | |
|---|---|
| PATENT NO. | : 6,781,219 B2 |
| APPLICATION NO. | : 10/229845 |
| DATED | : August 24, 2004 |
| INVENTOR(S) | : Lucien J. Bissey |

It is certified that error appears in the above-identified patent and that said Letters Patent is hereby corrected as shown below:

On the title page:
In item (54) Title,    LINE 2,    change, "CHARACTERS" to --CAPACITORS AND METHOD--

In the drawings:
In FIGS. 2, 3 and 4,    add references numeral --10-- with appropriate arrow-pointed lead line Replace FIG. 2 with the following:

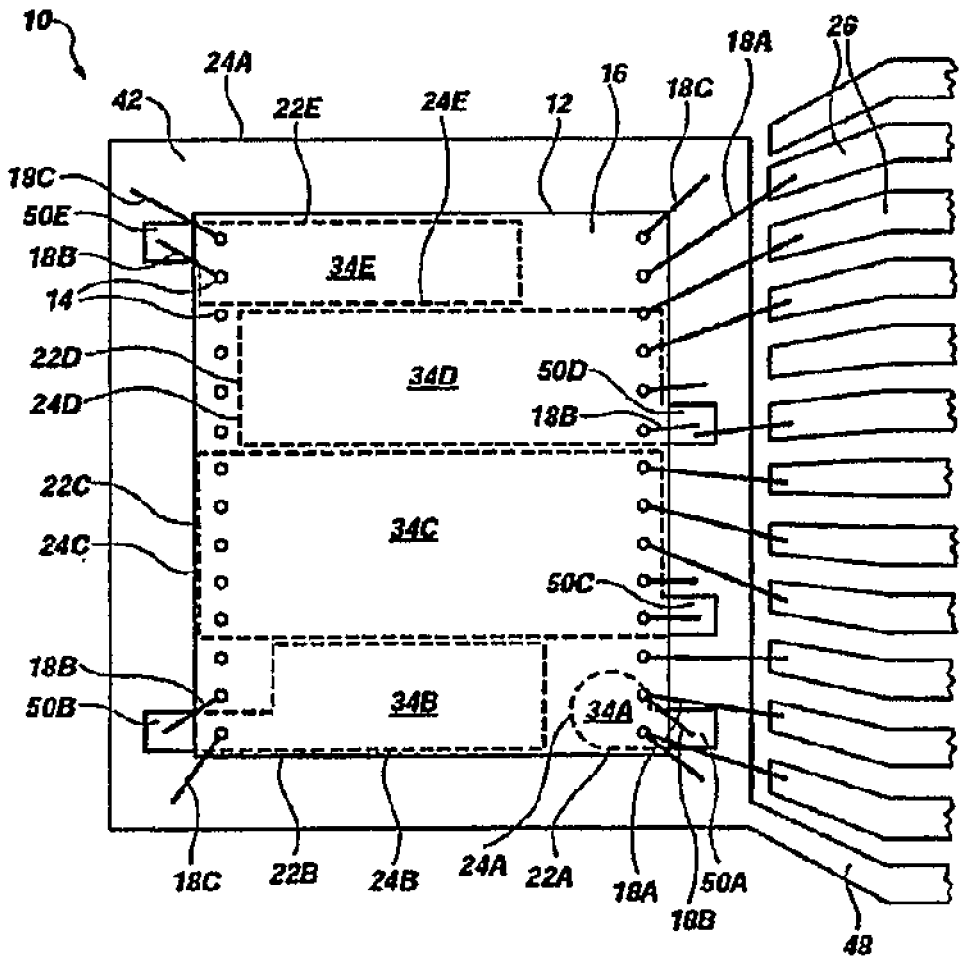

Fig. 2

UNITED STATES PATENT AND TRADEMARK OFFICE
CERTIFICATE OF CORRECTION

PATENT NO. : 6,781,219 B2
APPLICATION NO. : 10/229845
DATED : August 24, 2004
INVENTOR(S) : Lucien J. Bissey It is certified that error appears in the above-identified patent and that said Letters Patent is hereby corrected as shown below:

In the drawings (cont'd):

Replace FIG. 3 with the following:

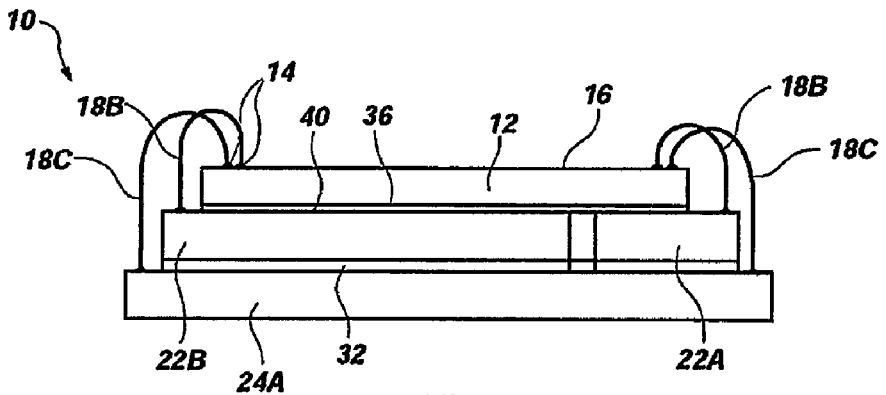

Fig. 3

Replace FIG 4. with the following:

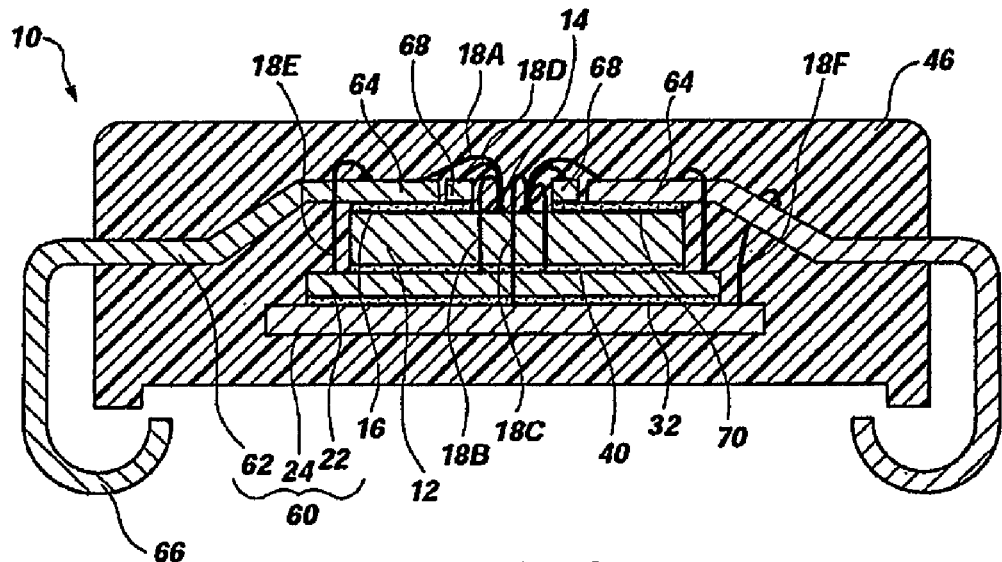

Fig. 4

UNITED STATES PATENT AND TRADEMARK OFFICE
CERTIFICATE OF CORRECTION

| | | |
|---|---|---|
| PATENT NO. | : 6,781,219 B2 | Page 3 of 3 |
| APPLICATION NO. | : 10/229845 | |
| DATED | : August 24, 2004 | |
| INVENTOR(S) | : Lucien J. Bissey | |

It is certified that error appears in the above-identified patent and that said Letters Patent is hereby corrected as shown below:

In the specification:

COLUMN 1, LINE 2, change "CHARACTERS" to --CAPACITORS AND METHOD--

Signed and Sealed this

Twenty-ninth Day of May, 2007

JON W. DUDAS
*Director of the United States Patent and Trademark Office*